(12) United States Patent
Do et al.

(10) Patent No.: US 10,867,956 B2
(45) Date of Patent: Dec. 15, 2020

(54) METHOD OF MANUFACTURING A SEMICONDUCTOR DEVICE

(71) Applicant: Amkor Technology, Inc., Tempe, AZ (US)

(72) Inventors: Won Chul Do, Bucheon-si (KR); Jin Hee Park, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 553 days.

(21) Appl. No.: 14/822,487

(22) Filed: Aug. 10, 2015

(65) Prior Publication Data
US 2016/0079201 A1 Mar. 17, 2016

(30) Foreign Application Priority Data
Aug. 11, 2014 (KR) .......................... 10-2014-0103751

(51) Int. Cl.
*H01L 23/00* (2006.01)
*H01L 21/56* (2006.01)
(Continued)

(52) U.S. Cl.
CPC ............ *H01L 24/81* (2013.01); *H01L 21/563* (2013.01); *H01L 23/49827* (2013.01); *H05K 3/3436* (2013.01); *H01L 2224/0401* (2013.01); *H01L 2224/05568* (2013.01); *H01L 2224/131* (2013.01); *H01L 2224/13147* (2013.01); *H01L 2224/16227* (2013.01); *H01L 2224/32225* (2013.01); *H01L 2224/73204* (2013.01); *H01L 2224/81191* (2013.01); *H01L 2224/81815* (2013.01); *H01L 2224/92125* (2013.01);
(Continued)

(58) Field of Classification Search
CPC . H01L 24/81; H01L 21/563; H01L 23/49827; H05K 3/3436; Y02P 70/613; Y10T 29/4913; Y10T 29/49126; Y10T 29/49124; Y10T 29/49117; Y10T 29/49002
USPC .................. 29/830, 829, 825, 592.1, 832
See application file for complete search history.

(56) References Cited

U.S. PATENT DOCUMENTS

| | | | |
|---|---|---|---|
| 2006/0223232 A1* | 10/2006 | Egawa | H01L 21/563 438/109 |
| 2007/0158856 A1* | 7/2007 | Narkhede | H05K 3/303 257/778 |

(Continued)

FOREIGN PATENT DOCUMENTS

| | | |
|---|---|---|
| KR | 20100054602 | 5/2010 |
| KR | 20100118935 | 11/2010 |

(Continued)

OTHER PUBLICATIONS

Office action including Search Report corresponding to Taiwan Patent Application No. 104126062, completed Jun. 14, 2016, with English translation.

*Primary Examiner* — Peter Dungba Vo
*Assistant Examiner* — Azm A Parvez
(74) *Attorney, Agent, or Firm* — McAndrews, Held & Malloy, Ltd.

(57) ABSTRACT

A method for manufacturing a semiconductor device, for example formed utilizing component stacking. As non-limiting examples, various aspects of this disclosure provide a method for reducing warpage and/or stress in stacked semiconductor devices.

7 Claims, 3 Drawing Sheets

(51) Int. Cl.
*H05K 3/34* (2006.01)
*H01L 23/498* (2006.01)

(52) U.S. Cl.
CPC ............. *H01L 2924/15311* (2013.01); *H01L 2924/3511* (2013.01); *H05K 2201/09136* (2013.01); *H05K 2201/10378* (2013.01); *H05K 2201/10674* (2013.01); *H05K 2201/10977* (2013.01); *H05K 2203/047* (2013.01); *H05K 2203/1476* (2013.01); *Y02P 70/50* (2015.11); *Y10T 29/4913* (2015.01)

(56) References Cited

U.S. PATENT DOCUMENTS

| | | |
|---|---|---|
| 2007/0238220 A1 | 10/2007 | Lii et al. |
| 2011/0171756 A1* | 7/2011 | Andry ............... H01L 25/18 438/4 |
| 2014/0073087 A1* | 3/2014 | Huang ............. H01L 25/0657 438/107 |
| 2014/0134804 A1 | 5/2014 | Kelly et al. |
| 2014/0264849 A1* | 9/2014 | Chen ............... H01L 25/50 257/737 |
| 2015/0228614 A1* | 8/2015 | Interrante ........ H01L 23/49816 438/107 |
| 2015/0243642 A1 | 8/2015 | Chen et al. |

FOREIGN PATENT DOCUMENTS

| | | |
|---|---|---|
| KR | 20130045138 | 5/2013 |
| TW | 200737444 | 10/2007 |
| TW | 201411745 | 3/2014 |
| TW | 201430968 | 8/2014 |

\* cited by examiner

METHOD OF MANUFACTURING A SEMICONDUCTOR DEVICE

CROSS-REFERENCE TO RELATED APPLICATIONS/INCORPORATION BY REFERENCE

The present application makes reference to, claims priority to, and claims the benefit of Korean Patent Application No. 10-2014-0103751, filed on Aug. 11, 2014 in the Korean Intellectual Property Office and titled "MANUFACTURING METHOD OF SEMICONDUCTOR DEVICE," the contents of which are hereby incorporated herein by reference, in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Present methods for forming various semiconductor devices, for example stacked packages, are inadequate, for example resulting in device warpage, excess mechanical stress, and/or unreliability. Further limitations and disadvantages of conventional and traditional approaches will become apparent to one of skill in the art, through comparison of such approaches with the present disclosure as set forth in the remainder of the present application with reference to the drawings.

BRIEF DESCRIPTION OF SEVERAL VIEWS OF THE DRAWINGS

The accompanying drawings are included to provide a further understanding of the present disclosure, and are incorporated in and constitute a part of this specification. The drawings illustrate examples of the present disclosure and, together with the description, serve to explain various aspects of the present disclosure. In the drawings.

SUMMARY

Figure 1:
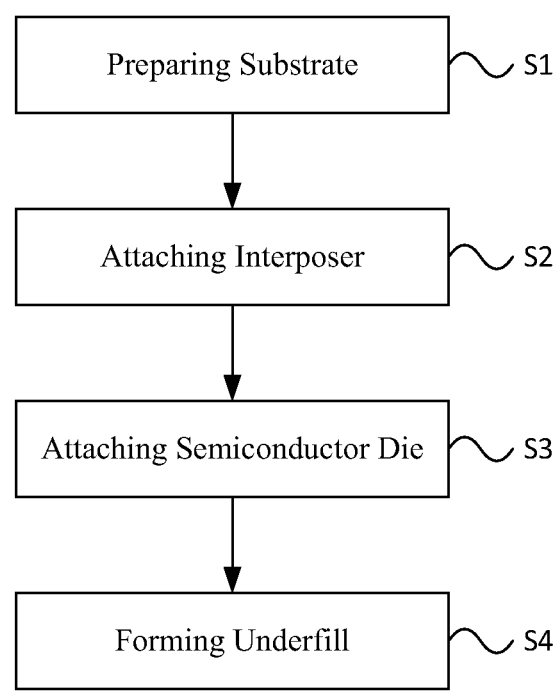
FIG. 1 is a flow diagram of an example method of manufacturing a semiconductor device, in accordance with various aspects of the present disclosure.

Various aspects of this disclosure provide a method for manufacturing a semiconductor device, for example formed utilizing component stacking. As non-limiting examples, various aspects of this disclosure provide a method for reducing warpage and/or stress in stacked semiconductor devices.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

In the drawings, various dimensions (e.g., layer thickness, width, etc.) may be exaggerated for illustrative clarity. Additionally, like reference numbers are utilized to refer to like elements through the discussions of various examples.

Various aspects of the present disclosure provide a method of manufacturing a semiconductor device (e.g., a so-called stacked device) and a resulting semiconductor device, which can decrease the warpage and related stresses and/or increase the reliability of the semiconductor device.

According to various aspects of the present invention, there is provided an example method of manufacturing a semiconductor device, the method comprising receiving and/or preparing a substrate (e.g., a circuit board, etc.), mounting an interposer on the substrate and attaching the interposer to the substrate by a first reflow process, mounting a semiconductor die on the interposer and attaching the semiconductor die to the interposer by a second reflow process, and forming (e.g., injecting, etc.) an underfill in spaces (or regions) between the substrate and the interposer and between the interposer and the semiconductor die.

The interposer, which may for example be thinner than the semiconductor die and/or the substrate, may for example be bent (or warped) in the first reflow process and then flattened in the second reflow process. For example, attachment structures attaching the interposer to the substrate may be reflowed a second time during the second reflow process to allow for the planarity of the interposer to change during the second reflow process.

In the forming of the underfill, the underfill may for example be formed in the spaces between the substrate and the interposer and between the interposer and the semiconductor die, for example simultaneously and/or sequentially.

The substrate (e.g., a circuit board, package substrate, etc.) may, for example, comprise an insulation layer, a first circuit pattern formed on a top surface of the insulation layer, a second circuit pattern formed on a bottom surface of the insulation layer, a first dielectric layer on the insulation layer and on the first circuit pattern exposing a portion of the first circuit pattern (e.g., through one or more first apertures in the first dielectric layer), and a second dielectric layer on the insulation layer and on the second circuit pattern exposing a portion of the second circuit pattern (e.g., through one or more second apertures in the second dielectric layer).

The interposer may, for example, comprise an insulator, a conductive via passing through the insulator and connecting top and bottom surfaces of the insulator (e.g., electrically connecting respective conductive layers or traces formed on the top and bottom surfaces of the insulator), and a conductive interconnection structure (e.g., a solder ball) formed on the bottom surface of the insulator. In the attaching of the interposer, the conductive interconnection structure may then be fused to the first circuit pattern of the substrate.

The semiconductor die may, for example, comprise a bond pad formed on its bottom surface (e.g., active surface) and a conductive interconnection structure (e.g., a conductive bump) formed on the bond pad, and in the attaching of the semiconductor die, the conductive bump may be electrically connected to the conductive via of the interposer (or a conductive layer or trace connected thereto).

In the forming of the underfill, the underfill may be formed around conductive interconnection structures (e.g., solder balls) between the interposer and the substrate, and around conductive interconnection structures (e.g., conductive bumps) between the semiconductor die and the interposer.

In the example manufacturing method above and in accordance with various aspects of the present disclosure, the interposer may be mounted on the substrate and attached to the substrate utilizing a first reflow process, a semiconductor die may then be mounted on the interposer and attached to the interposer utilizing a second reflow process, and the relatively thin interposer (e.g., thin relative to the substrate and/or semiconductor die) may for example be slightly bent in the first reflow process and then flattened in the second reflow process. For example, in a method of manufacturing a semiconductor device in accordance with various aspects of the present disclosure, it is possible to reduce or minimize the extent to which the relatively thin interposer is bent by performing two reflow process steps.

The above and other aspects of the present disclosure will be described in or be apparent from the following description of various example implementations. For example, various aspects of the present disclosure will now be presented with reference to accompanying drawings, such that those skilled in the art may readily practice the various aspects. It should be noted that, that the scope of this disclosure is not limited by characteristics of the particular examples discussed herein.

FIG. 1 is a flow diagram illustrating a method of manufacturing a semiconductor device, in accordance with various aspects of the present disclosure, and FIGS. 2A-2D show cross-sectional views illustrating an example semiconductor device and/or various stages of a method of manufacturing a semiconductor device (e.g., the method of FIG. 1), in accordance with various aspects of the present disclosure.

Referring to FIG. 1, an example method of manufacturing a semiconductor device may, for example, comprise preparing (or receiving) a substrate (S1), attaching an interposer to the substrate (S1), attaching a semiconductor die to the interposer (S3), and forming an underfill (S4). Various example process steps illustrated in FIG. 1 will be described herein with reference to FIGS. 2A-2D.

Block S1 may, for example, comprise preparing (or receiving) a substrate. Block S1 may, for example, comprise performing such preparing (or receiving) in any of a variety of manners, non-limiting examples of which are provided herein. For example, block S1 may, for example, comprise receiving and/or preparing a panel of substrates and/or individual singulated substrates. Block S1 may, for example, comprise preparing the substrate for subsequent attachment of an interposer to the substrate (e.g., at block S2), where such preparing may, for example, comprise any one or more of: receiving, handling, cleaning, placing, surface preparing, testing, singulating, mounting to a fixture, loading into a machine, etc. Note that the blocks shown in FIG. 1 may be performed on a singulated substrate or may be performed on a substrate in panel form (e.g., including a plurality of single substrates coupled together), which may then be singulated later (e.g., after any of the example blocks shown in FIG. 1 discussed herein, after any of a variety of other production processes, etc.).

The substrate 110 may comprise any of a variety of characteristics, non-limiting examples of which are provided herein. The substrate 110 may, for example, comprise laminates, a resin impregnated B-stage cloth (pre-preg), copper foil, copper-clad laminates, built-up layers of dielectric and conductor, glass, plastic, mold material, etc. The substrate 110 may, for example, comprise a circuit board substrate (e.g., a semiconductor device package substrate, etc.). For example, the substrate 110 may comprise a package substrate on which a semiconductor device package is constructed, which may ultimately be coupled to a motherboard or other circuit board along with a plurality of other electronic devices.

Figure 2A:
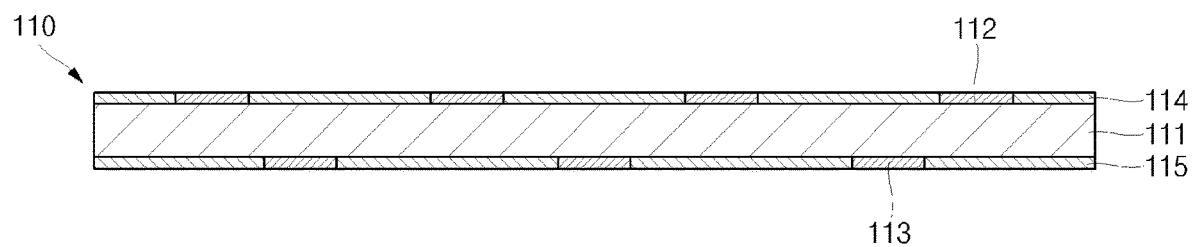
FIGS. 2A-2D show cross-sectional views illustrating an example semiconductor device and an example method of making a semiconductor device, in accordance with various aspects of the present disclosure.

FIG. 2A shows various characteristics of an example substrate 110 (e.g., a circuit board or other substrate). For example, the substrate 110 may comprise one or more insulation (or dielectric) layers 111, a first circuit pattern 112 formed on a top surface of the insulation layer 111, a second circuit pattern 113 formed on a bottom surface of the insulation layer 111, a first dielectric layer 114 formed on the top surface of the insulation layer 111 and exposing a portion of the first circuit pattern 112 (e.g., through at least a first aperture in the first dielectric layer 114), and a second dielectric layer 115 formed on the bottom surface of the insulation layer 111 and exposing a portion of the second circuit pattern 113 (e.g., through at least a second aperture in the second dielectric layer 115). The first dielectric layer 114 and/or the second dielectric layer 115 may also be referred to herein as passivation layers.

Block S2 may, for example, comprise attaching an interposer to the substrate (e.g., the substrate prepared and/or received at block S1). For example, block S2 may comprise attaching an interposer to a top surface (or portion thereof) of the substrate prepared at block S1.

Figure 2B:
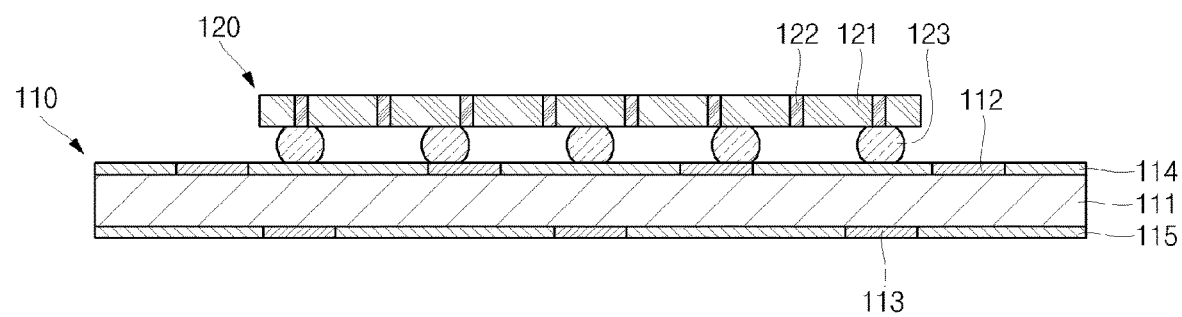

Referring to FIG. 2B, block S2 may comprise mounting (or positioning) the interposer 120 on a top surface (or portion thereof) of the substrate 110, and electrically and/or mechanically attaching the interposer 120 to the substrate 110. Such attaching may be performed in any of a variety of manners. For example, block S2 may comprise performing a first reflow process (e.g., mass reflow, infrared (IR) reflow, convection reflow, thermocompression bonding, etc.).

The interposer 120 may comprise any of a variety of characteristics, non-limiting examples of which are presented herein. For example, the interposer 120 may comprise a silicon or other semiconductor die (e.g., with or without active semiconductor devices formed thereon). For example, the interposer 120 may comprise a semiconductor die with signal routing traces on one or more surfaces and/or through the interposer. The interposer 120 may also, for example, comprise a silicon interposer, a glass interposer, a printed circuit board interposer, etc.

The interposer 120 may, for example, comprise an insulator 121 (e.g., at least one dielectric layer) and a conductive via 122 passing through the insulator 121 (e.g., passing directly or indirectly through the insulator) and connecting top and bottom surfaces of the insulator 121. The conductive via 122 may comprise any of a variety of characteristics. For example, the conductive via 122 may be any type of via that electrically connects conductors on the top and bottom surfaces of the insulator 121 (e.g., a straight-through via, etc.). For example, the conductive via 122 may be a through silicon via (TSV).

In addition, an interconnection structure 123 (e.g., a conductive ball, a solder ball, a conductive bump, a solder bump, a conductive pillar, a copper pillar, a copper pillar with a solder cap, etc.) may be formed on the bottom surface of the interposer 120. For example, a circuit pattern (not shown) (e.g., traces, lands, etc.) may be formed on the bottom surface of the interposer 120 and the interconnection structure 123 fused to (or otherwise formed on) such circuit pattern. Also for example, a circuit pattern (not shown) (e.g., traces, lands, etc.) may be formed on the top surface of the interposer 120, and the semiconductor die 130, such as a memory chip or a logic chip, may be stacked on such circuit pattern.

In an example implementation, at block S2, the interconnection structure 123 of the interposer 120 (e.g., a conductive ball) is fused (e.g., soldered) to the first circuit pattern 112 of the substrate 110. The interposer 120 may, for example, be relatively thin compared to the thickness of the substrate 110 (e.g., circuit board). For example, the substrate 110 may comprise a thickness that is at least two times the thickness of the interposer 120, at least five times the thickness of the interposer 120, etc. Additionally, the interposer 120 and the substrate 110 may, in various implementations, be formed of different respective materials (e.g., having significantly different respective thermal coefficients of expansion). Therefore, during the interposer attachment process at block S2, the interposer 120 may be substantially warped, for example relative to its condition prior to the interposer attachment process.

At block S3, the example method may comprise attaching one or more semiconductor die to the interposer (e.g., to a top surface of the interposer).

Figure 2C:
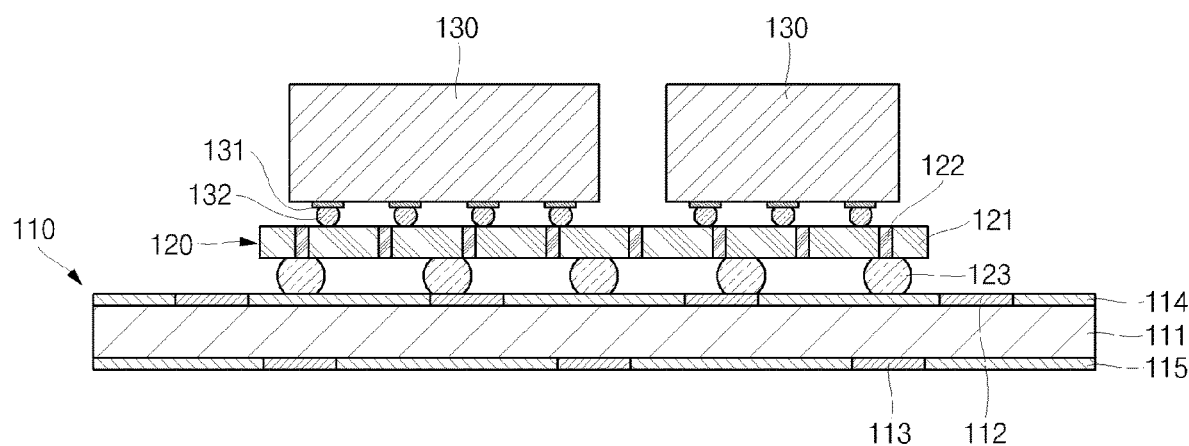

Referring to FIG. 2C, block S3 may comprise attaching one or more semiconductor die 130 to the interposer 120 (e.g., to a top surface thereof). For example, block S3 may comprise performing a second reflow process. The second reflow process may, for example, be a same type of reflow process as the first reflow process (e.g., a mass reflow processes, thermocompression reflow process, etc.). In various alternative implementations, however, the second reflow process may be different.

The semiconductor die 130 may, for example, be made of a semiconductor material (e.g., silicon), and a plurality of semiconductor devices may be formed therein (e.g., at a bottom surface of the semiconductor die 130 and/or a top surface of the semiconductor die 130). In addition, a plurality of bond pads 131 may be formed on the bottom surface of the semiconductor die 130, and a respective interconnection structure 132 (e.g., a conductive bump, a solder bump, a copper pillar, a copper pillar with a solder cap, a solder ball, etc.) may be formed on each of the bond pads 131. The respective interconnection structure 132 may, for example, be smaller than the interconnection structure 123. In the illustrated example, two semiconductor dies 130 are shown, but the number of the semiconductor dies 130 may be greater than or smaller than two. Additionally, one or more passive components may also be attached to the interposer 120.

Block S3 may, for example comprise fusing (e.g., soldering) the die-to-interposer interconnection structure 132 (e.g., conductive bump, etc.) to the circuit pattern (not shown) formed on the top surface of the interposer 120 to thus electrically connect the interconnection structure 132 to a conductive via 122. For example, the semiconductor die 130 may be electrically connected to the substrate 110 through a conductive via 122 of the interposer 120. The semiconductor die 130 may, for example, be thicker than the interposer 120. For example, the semiconductor die 130 may comprise a thickness that is at least two times the thickness of the interposer 120, at least five times the thickness of the interposer 120, etc.

At block S3, when the die attachment process is performed (e.g., when the second reflow process is performed), not only the die-to-interposer interconnection structure 132 (e.g., conductive bump, etc.) but also the interposer-to-substrate interconnection structure 123 (e.g., solder ball, etc.) may be subjected to a reflow process. In other words, the interposer-to-substrate interconnection structure 123 may be subjected to a second reflow process. Since in this example scenario, the space between the interposer 120 and the substrate 110 has yet to be underfilled, the interposer-to-substrate interconnection structure 123 may reflow in a relatively unconstrained manner (e.g., relative to a scenario in which the interposer-to-substrate interconnection structure 123 is surrounded by underfill), and the planarity of the interposer may change. In other words, in a scenario in which the interposer 120 is bent (or warped) during the interposer attaching process at block S2, the interposer 120 may be flattened during or after the die attaching process at block S3. This flattening of the interposer 120 may, for example, be caused by forces within the structures being bonded (e.g., surface tension forces in the interconnection structures 132 and/or 123, etc.). For example, during the second reflow process, the semiconductor die itself may apply a flattening force to the interposer during the second reflow process. The flattening of the interposer 120 may also, for example, be caused by externally applied flattening forces that are applied to the overall structure during the second reflow process (e.g., a press plate, etc.).

In an example scenario, the interposer 120 may be warped a first amount (e.g., to a first amount of non-planarity, non-linearity, radius of curvature, planar deviation, etc.) after the interposer attaching process at block S2, and the interposer 120 may be warped a second amount (e.g., to a first amount of non-planarity, non-linearity, radius of curvature, planar deviation, etc.) after the die attaching process at block S3. The second amount of warpage may, for example, be at least 2%, 5%, or 10% less than the first amount of warpage.

At block S4 (e.g., after the interposer attaching at block S2 and after the die attaching at block S3), underfill may be formed (e.g., injected, etc.) in spaces between the substrate 110 and the interposer 120 and between the interposer 120 and the semiconductor die 130.

Figure 2D:
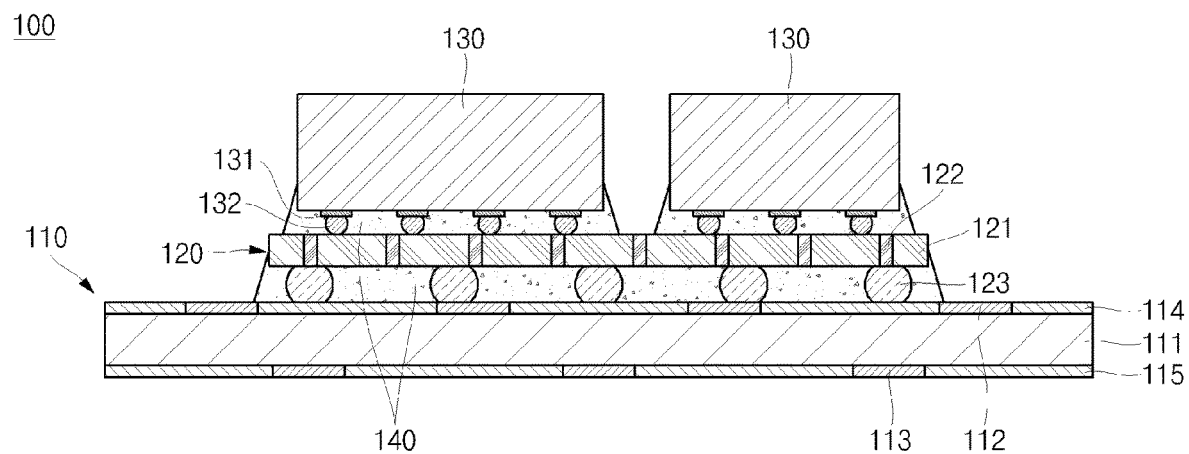

Referring to FIG. 2D, in the forming of the underfill at block S4, the underfill 140 is formed (e.g., injected, etc.) in spaces between the substrate 110 and the interposer 120 and between the interposer 120 and the semiconductor die 130, followed by curing, thereby adding structural integrity between the interposer 120, the semiconductor die 130, and the substrate 110.

The underfill 140 may, for example, be formed around the interposer-to-substrate interconnection structure 123 (or a plurality thereof) positioned between the substrate 110 and the interposer 120 and around the die-to-interposer interconnection structure 132 (or a plurality thereof) positioned between the interposer 120 and the semiconductor die 130. In addition, the underfill 140 may be formed in the spaces between the substrate 110 and the interposer 120 and between the interposer 120 and the semiconductor die 130 simultaneously or sequentially. The underfill 140 may then, for example, be subjected to a curing process. For example, a single curing process may be utilized to cure both the underfill 140 between the substrate 110 and the interposer 120 and the underfill 140 between the interposer 120 and the semiconductor die 130.

The underfill 140 between the semiconductor die 130 and the interposer 120 may, for example, be a same material as the underfill 140 between the interposer 120 and the substrate 110. Alternatively, for example, the underfill 140 between the semiconductor die 130 and the interposer 120 may be a different material than the underfill 140 between the interposer 120 and the substrate 110. For example, the underfill between the semiconductor die 130 and the interposer 120 may have a different (e.g., lower) viscosity than the underfill between the interposer 120 and the substrate 110. For example, there may be different respective gap sizes between the semiconductor die 130 and the interposer 120 and between the interposer 120 and substrate 110, for example providing an opportunity to utilize lower-cost underfill material to fill the larger gap.

The semiconductor device 100 completed by the above-described manufacturing method may, for example, comprise a substrate 110, an interposer 120 mounted on the substrate 110, a semiconductor die 130 mounted on the interposer 120, and underfill 140 formed in spaces between the substrate 110 and the interposer 120 and between the interposer 120 and the semiconductor die 130.

As described herein, in an example method of manufacturing a semiconductor device in accordance with various aspects of the present disclosure, the interposer may be attached to a first surface of a substrate, for example by performing a first reflow process, and a semiconductor die may then be attached to the interposer, for example by performing a second reflow process. For example, the relatively thin interposer may be slightly bent in the first reflow process and then flatted in the second reflow process. For example, manufacturing a semiconductor device in accordance with various aspects of the present disclosure may result in an interposer that is flat (or substantially flat) following multiple reflow processes.

In addition, in an example method of manufacturing a semiconductor device in accordance with various aspects of the present disclosure, the interposer and the semiconductor die may be mounted on the substrate, and underfill may be formed in the spaces between the substrate and the interposer and between the interposer and the semiconductor die, followed by curing, thereby simplifying the manufacturing process and reducing the manufacturing cost.

In summary, various aspects of this disclosure provide a method for manufacturing a semiconductor device, for example formed utilizing three-dimensional stacking. As non-limiting examples, various aspects of this disclosure provide a method for reducing warpage and/or stress in three-dimensional devices. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A method of manufacturing a semiconductor device, the method comprising:
    attaching an interposer to a substrate utilizing a first reflow process and a plurality of electrical interconnection structures;
    after said attaching an interposer, attaching a semiconductor die to the interposer utilizing a second reflow process;
    after said attaching a semiconductor die to the interposer, forming a first underfill between the interposer and the substrate, and forming a second underfill between the semiconductor die and the interposer, wherein the first underfill and the electrical interconnection structures are the only structures directly vertically between the interposer and the substrate; and
    after said forming a first underfill and said forming a second underfill, curing the first and second underfills, wherein:
        no underfill lies on the interposer prior to said attaching the semiconductor die to the interposer;
        the semiconductor die comprises a plurality of bond pads on a bottom surface the semiconductor die and a plurality of conductive bumps directly attached to the bond pads;
        said attaching the semiconductor die to the interposer comprises directly attaching the conductive bumps to the interposer; and
        said forming the second underfill comprises surrounding and directly contacting the conductive bumps with the second underfill.

2. The method of claim 1, wherein said forming a first underfill and said forming a second underfill are performed sequentially in separate respective process steps.

3. The method of claim 2, wherein said forming a first underfill is performed utilizing a first type of underfill having a first viscosity, and said forming a second underfill is performed utilizing a second type of underfill having a second viscosity different from the first viscosity.

4. The method of claim 1, wherein the first underfill comprises a first lateral side and a second lateral side opposite the first lateral side, and there is no material other than the first underfill and electrical interconnection structures positioned laterally between the first lateral side and the second lateral side.

5. The method of claim 1, wherein:
the interposer comprises a top interposer side, a bottom interposer side opposite the top interposer side, and a lateral interposer side that extends between the top interposer side and the bottom interposer side;
the semiconductor die comprises a top die side, a bottom die side opposite the top die side and attached to the top interposer side, and a lateral die side that extends between the top die side and the bottom die side; and
the first underfill contacts the lateral interposer side, and the second underfill contacts the lateral die side.

6. The method of claim 1, wherein immediately after said attaching an interposer, the interposer is warped a first amount, and immediately after said attaching a semiconductor die, the interposer has less warpage than the first amount.

7. The method of claim 1, wherein the second underfill directly contacts the semiconductor die.

* * * * *